United States Patent
Katoch

(10) Patent No.: US 12,230,316 B2
(45) Date of Patent: *Feb. 18, 2025

(54) MEMORY DEVICE INCLUDING MEMORY CELLS AND EDGE CELLS

(71) Applicant: Taiwan Semiconductor Manufacturing Co., Ltd., Hsin-Chu (TW)

(72) Inventor: Atuk Katoch, Kanata (CA)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/412,380

(22) Filed: Jan. 12, 2024

(65) Prior Publication Data

US 2024/0153550 A1    May 9, 2024

Related U.S. Application Data

(63) Continuation of application No. 17/883,998, filed on Aug. 9, 2022, now Pat. No. 11,900,994, which is a continuation of application No. 17/220,701, filed on Apr. 1, 2021, now Pat. No. 11,488,661.

(51) Int. Cl.
*G11C 5/14* (2006.01)
*G11C 11/417* (2006.01)
*H10B 10/00* (2023.01)

(52) U.S. Cl.
CPC ............ *G11C 11/417* (2013.01); *G11C 5/148* (2013.01); *H10B 10/12* (2023.02)

(58) Field of Classification Search
CPC ...... G11C 11/417; G11C 5/148; G11C 11/412; G11C 2207/2227; G11C 5/025; H10B 10/12
See application file for complete search history.

(56) References Cited

U.S. PATENT DOCUMENTS

| | | | |
|---|---|---|---|
| 8,325,542 B2 | 12/2012 | Ogura et al. | |
| 9,449,686 B2* | 9/2016 | Kwon | G11C 13/0028 |
| 10,269,435 B1 | 4/2019 | Chen et al. | |
| 2005/0073885 A1 | 4/2005 | Suzuki et al. | |
| 2006/0158926 A1 | 7/2006 | Yokoyama | |
| 2014/0367794 A1 | 12/2014 | Chan et al. | |
| 2017/0221542 A1* | 8/2017 | Derner | G11C 11/221 |
| 2018/0005938 A1 | 1/2018 | Liaw | |
| 2019/0066774 A1 | 2/2019 | Singh et al. | |
| 2022/0367484 A1 | 11/2022 | Yang et al. | |

* cited by examiner

*Primary Examiner* — Khamdan N. Alrobaie
(74) *Attorney, Agent, or Firm* — Duane Morris LLP

(57) ABSTRACT

A memory device including memory cells and edge cells is described. In one example, the memory device includes: an array of memory cells used for data storage; a plurality of first edge cells not used for data storage; and a plurality of second edge cells not used for data storage. The plurality of first edge cells and the plurality of second edge cells are arranged respectively at two opposite sides of the array of memory cells. At least one edge cell, among the plurality of first edge cells and the plurality of second edge cells, comprises a circuit configured for controlling the array of memory cells to enter or exit a power down mode.

20 Claims, 11 Drawing Sheets

MEMORY DEVICE INCLUDING MEMORY CELLS AND EDGE CELLS

CROSS-REFERENCE TO RELATED APPLICATION

This application is a continuation of U.S. patent application Ser. No. 17/883,998, filed Aug. 9, 2022, which is a continuation of U.S. patent application Ser. No. 17/220,701, filed on Apr. 1, 2021, which is incorporated by reference herein in its entirety.

BACKGROUND

The semiconductor integrated circuit (IC) industry has provided a wide variety of memory devices to address issues in a number of different areas. A memory device, e.g. a static random access memory (SRAM) device, is built using an array of memory cells which have edge cells on both sides of the array. The edge cells can maintain continuity of the layout patterns of the memory cells, alleviate latch-up concerns in the memory device, and reduce the memory design complexity for manufacturability.

However, edge cells in a memory device consume a significant area of the memory device. For example, an existing memory device including an array of 256 memory cells has 10 edge cells on each side of the array. When each memory cell and each edge cell occupy a same area, e.g. 2 contacted poly pitches (CPPs); the memory device has an overhead of about 7.8%.

BRIEF DESCRIPTION OF THE DRAWINGS

Aspects of the present disclosure are best understood from the following detailed description when read with the accompanying figures. It is noted that various features are not necessarily drawn to scale. In fact, the dimensions and geometries of the various features may be arbitrarily increased or reduced for clarity of discussion Like reference numerals denote like features throughout specification and drawings.

DETAILED DESCRIPTION OF EXEMPLARY EMBODIMENTS

Figure 1:
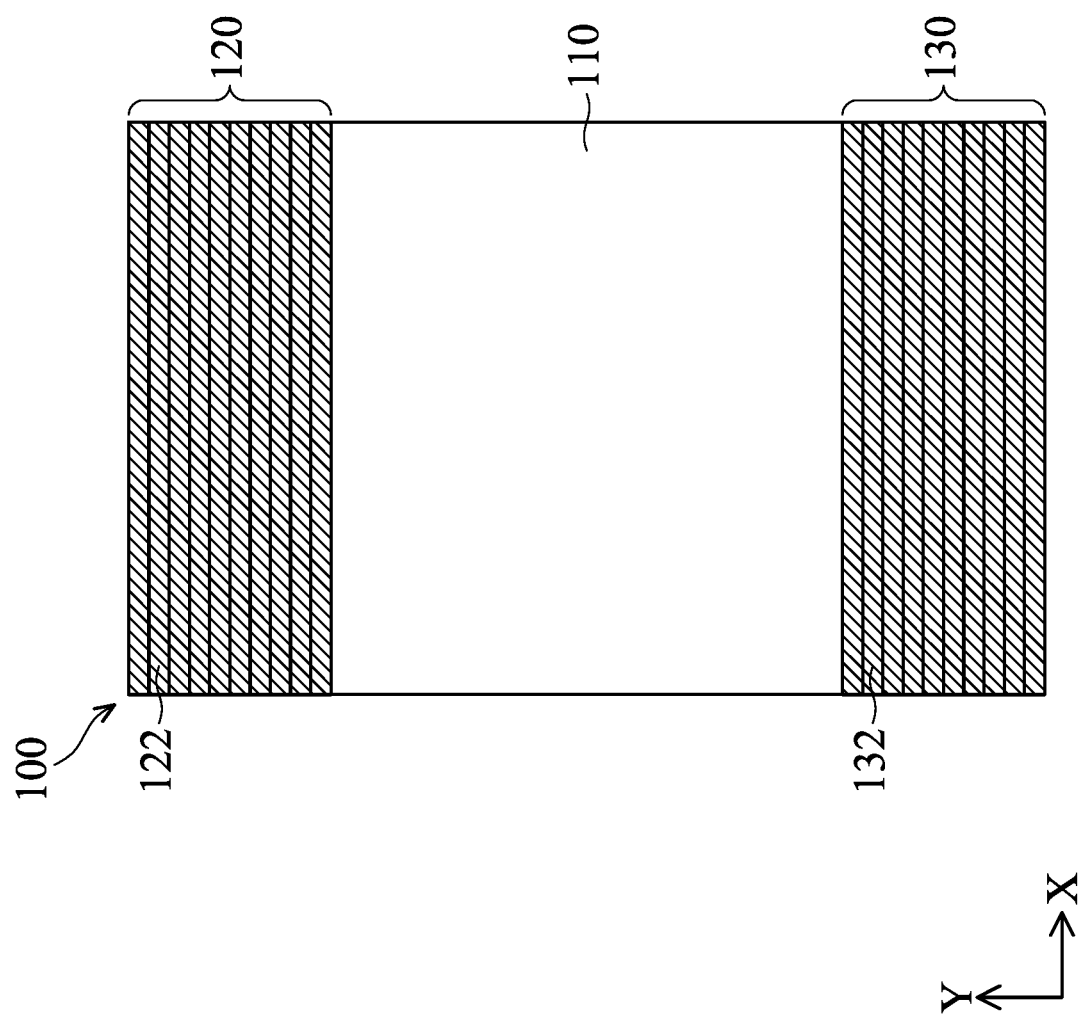
FIG. 1 illustrates an exemplary layout of an exemplary memory device including memory cells and edge cells, in accordance with some embodiments of the present disclosure.

The following disclosure describes various exemplary embodiments for implementing different features of the subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Terms such as "attached," "affixed," "connected" and "interconnected," refer to a relationship wherein structures are secured or attached to one another either directly or indirectly through intervening structures, as well as both movable or rigid attachments or relationships, unless expressly described otherwise.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Reference will now be made in detail to the present embodiments of the disclosure, examples of which are illustrated in the accompanying drawings. Wherever possible, the same reference numbers are used in the drawings and the description to refer to the same or like parts.

The present teaching discloses a memory device including both an array of memory cells used for data storage and a plurality of edge cells not used for data storage. The edge cells are arranged at both sides of the array to maintain regularity and continuity of the layout patterns of the memory cells. According to some embodiments of the present teaching, edge cells of the memory device are converted into power headers and/or power footers, while maintaining the continuity. In addition, word lines of these edge cells are utilized to control ON/OFF functions of the power headers and/or power footers. The word lines of these edge cells may be controlled by power management signals. In this manner, the area of the memory cell can be saved, e.g. by 3% to 8%.

In some embodiments, each edge cell includes a circuit configured for controlling the array of memory cells to enter or exit a power down mode. For example, the edge cell may include a power switch configured for controlling a power supply to the array of memory cells. In one case, the power switch may comprise two p-type metal-oxide-semiconductor (PMOS) transistors and serve as a power header to control the power supply to the array of memory cells. In another case, the power switch may comprise two n-type metal-oxide-semiconductor (NMOS) transistors and serve as a power footer to control the power supply to the array of memory cells. In both cases, the power switch is controlled by a word line of the edge cell. Voltages of the word lines of the edge cells may be controlled by a common power management signal. In some embodiments, some edge cells of the memory device include power headers, while other edge cells of the memory device include power footers.

FIG. 1 illustrates an exemplary layout of an exemplary memory device 100 including memory cells 110 and edge cells 120, 130, in accordance with some embodiments of the present disclosure. As shown in FIG. 1, the exemplary memory device 100 includes an array of memory cells 110, a first edge cell column 120 including a plurality of first edge cells 122, and a second edge cell column 130 including a plurality of second edge cells 132. In some embodiments, the memory device 100 may be a static random access memory (SRAM) chip, and the array 110 includes SRAM cells.

In the example shown in FIG. 1, the first edge cell column 120 and the second edge cell column 130 are arranged along the vertical direction Y of the array of memory cells 110. That is, the first edge cell column 120 and the second edge cell column 130 are arranged on the upper and lower sides of the array of memory cells 110 respectively. In other embodiments of the present teaching, the first edge cell column 120 and the second edge cell column 130 may be arranged along the horizontal direction X of the array of memory cells 110, e.g. the first edge cell column 120 and the second edge cell column 130 are arranged on the left and right sides of the array of memory cells 110 respectively.

The array of memory cells 110 are used for data storage, while the plurality of first edge cells 122 and the plurality of second edge cells 132 are not used for data storage. The plurality of first edge cells 122 and the plurality of second edge cells 132 are arranged respectively at two opposite sides of the array of memory cells 110. In some embodiments, these edge cells are feature dummy cells having the same layout patterns as the memory cells 110. The edge cells 122, 132 can maintain the continuity and homogeneity for the memory cells on the edge of the array 110.

In the example shown in FIG. 1, there are ten edge cells on each side of the array of memory cells 110. In some embodiments, each edge cell occupies an area of 2 contacted poly pitches (CPPs), and each memory cell also occupies an area of 2 CCPs. The number of edge cells on each side of the array of memory cells 110 may be changed according to different embodiments of the present teaching. To avoid wasting areas and resources of these edge cells, as disclosed in detail later, at least one of the edge cells may include a circuit configured for controlling the array of memory cells 110 to enter or exit a power down mode, where the circuit includes a power header switch or a power footer switch to control a power supply to the array of memory cells 110, based on a word line voltage controlled by a power management signal. For example, when the array of memory cells 110 includes 256 memory cells and has 10 edge cells on each side, the memory device 100 has an overhead of about 7.8%. In contrast, when each of the edge cells of the memory device 100 functions as a power header or power footer to control the array of memory cells 110 to enter or exit the power down mode, the overhead can be avoided. At the same time, the continuity and homogeneity for the memory cells on the edge of the array 110 can still be achieved because the active regions are the same for the memory cells and the edge cells.

In some embodiments, the layout in FIG. 1 corresponds to a SRAM chip including a SRAM array 110 having 256 SRAM cell rows; 10 first edge cell rows 122 on the upper side of the SRAM array 110; and 10 second edge cell rows 132 on the lower side of the SRAM array 110. Each SRAM cell row includes a plurality of SRAM cells arranged in a row along the X direction, and has a height of 2 poly pitches. Each first edge cell row 122 includes a plurality of first edge cells arranged in a row along the X direction, and has a height of 2 poly pitches. Each second edge cell row 132 includes a plurality of second edge cells arranged in a row along the X direction, and has a height of 2 poly pitches.

Figure 2:
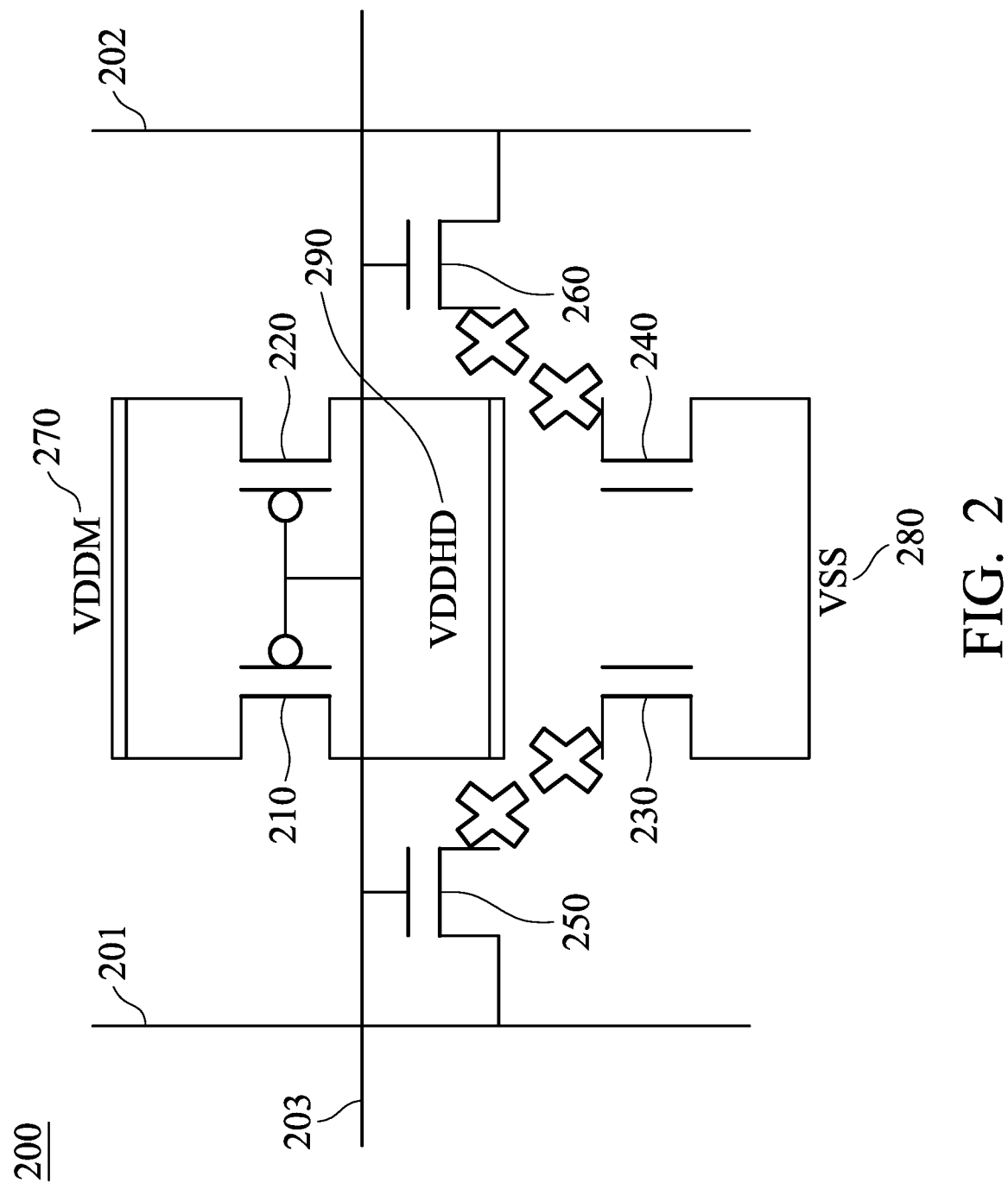
FIG. 2 illustrates an exemplary circuit in an edge cell of a memory device, in accordance with some embodiments of the present disclosure.

FIG. 2 illustrates an exemplary circuit 200 in an edge cell of a memory device, e.g. the memory device 100 in FIG. 1, in accordance with some embodiments of the present disclosure. As shown in FIG. 2, the circuit 200 includes a pair of PMOS transistors 210, 220 and a pair of NMOS transistors 230, 240. Gates of the PMOS transistors 210, 220 are coupled to each other and coupled to a word line 203 crossing the edge cell. Sources of the PMOS transistors 210, 220 are coupled to a positive power supply voltage (VDDM) 270; and drains of the PMOS transistors 210, 220 are coupled to a power header supply voltage (VDDHD) 290 for controlling the memory cells of the memory device to enter or exit a power down mode. In the power down mode (or say power saving mode), a power supply to the memory cells is stopped and there is no current flowing into the memory cells.

As shown in FIG. 2, the PMOS transistors 210, 220 can function as a power switch, called a power header, for controlling the power header supply voltage (VDDHD) 290. When the word line 203 of the edge cell switches from a logic low power level to a logic high power level, the power header is disabled and the VDDHD 290 is floating. Because the VDDHD lines of the memory cells are electrically connected to the VDDHD 290 of the edge cell, the array of memory cells enters the power down mode and no current flows into the memory cells. When the word line 203 of the edge cell switches from a logic high power level to a logic low power level, the power header is enabled and the VDDHD 290 has the same voltage as the VDDM 270. Because the VDDHD lines of the memory cells are electrically connected to the VDDHD 290, current flows into the memory cells such that the memory cells exit the power down mode.

As shown in FIG. 2, gates of the NMOS transistors 230, 240 are electrically isolated from each other; while drains of the NMOS transistors 230, 240 are coupled to a negative power supply voltage (VSS) 280. As shown in FIG. 2, the circuit 200 also includes a pair of NMOS transistors 250, 260 whose gates are coupled to the word line 203. Source of the NMOS transistor 250 is coupled to a bit line 201 crossing the edge cell; and source of the NMOS transistor 260 is coupled to a bit line bar 202 crossing the edge cell. The term "bar" as used in this context indicates a logically inverted signal.

Figure 3:
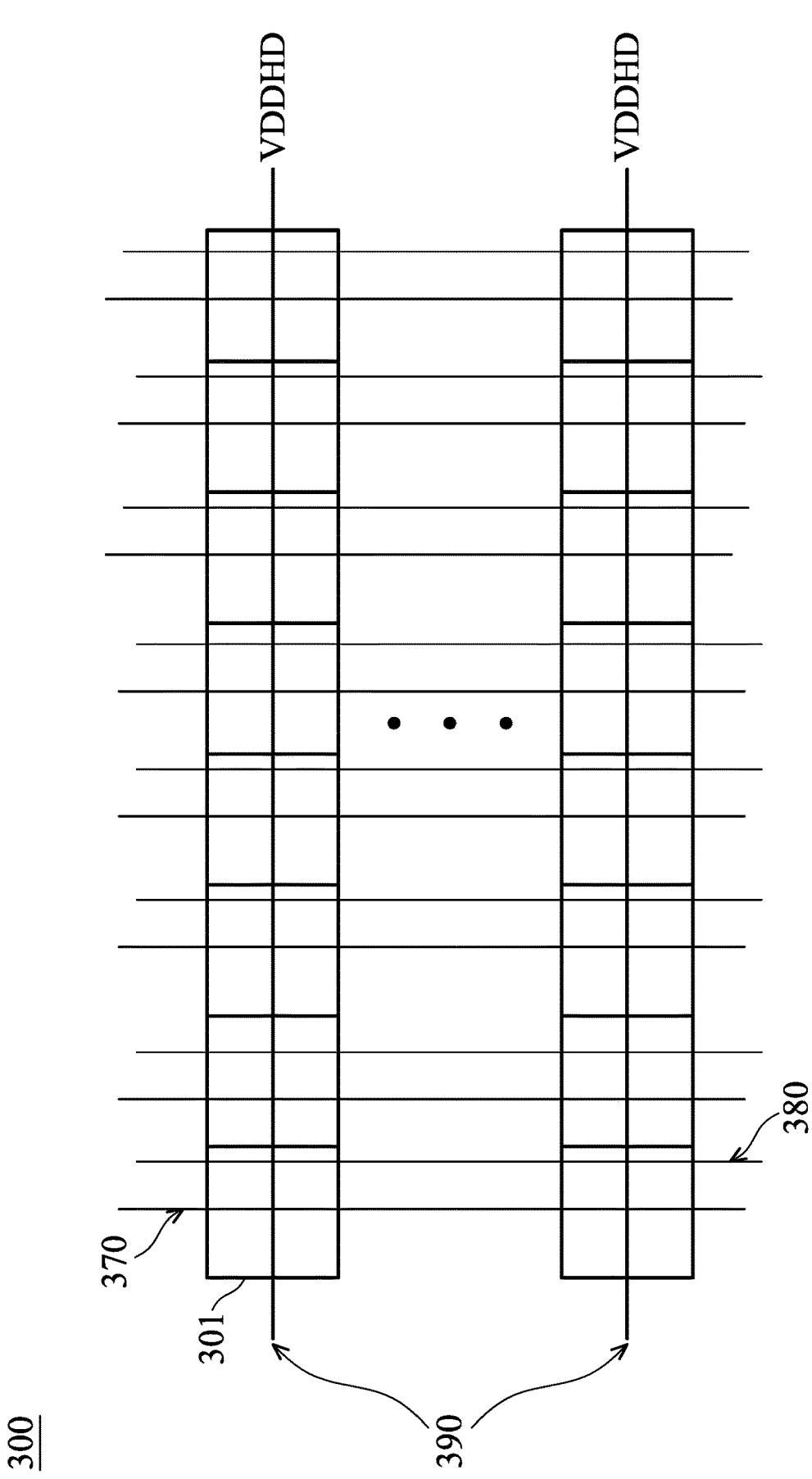
FIG. 3 illustrates an exemplary layout of edge cells in a memory device, in accordance with some embodiments of the present disclosure.

As shown in FIG. 2, source of the NMOS transistor 230 is not electrically connected to the NMOS transistor 250; and source of the NMOS transistor 240 is not electrically connected to the NMOS transistor 260. FIG. 3 illustrates an exemplary power mesh layout 300 of edge cells in a memory device, e.g. the first edge cell rows 122 and/or the second edge cell rows 132 of the memory device 100 in FIG. 1, in accordance with some embodiments of the present disclosure. As shown in FIG. 3, the edge cells 301 are arranged in multiple edge cell rows, each of which has a corresponding VDDHD line 390 that crosses all edge cells 301 of the edge cell row, like the VDDHD line 290 in FIG. 2. Each edge cell 301 also has a VDDM line 370 crossing by and a VSS line 380 crossing by. The edge cells 301 arranged in a same column may share a same VDDM line 370 and a same VSS line 380. The directions of the VDDHD lines 390, the VDDM lines 370, and the VSS lines 380 are merely for illustration, and can be different in accordance with different embodiments. In some embodiments, the VDDM lines 370 and the VSS lines 380 are formed in a M0 metal layer of the memory device, while the VDDHD lines 390 are formed in a M1 metal layer above the M0 metal layer.

Figure 4:
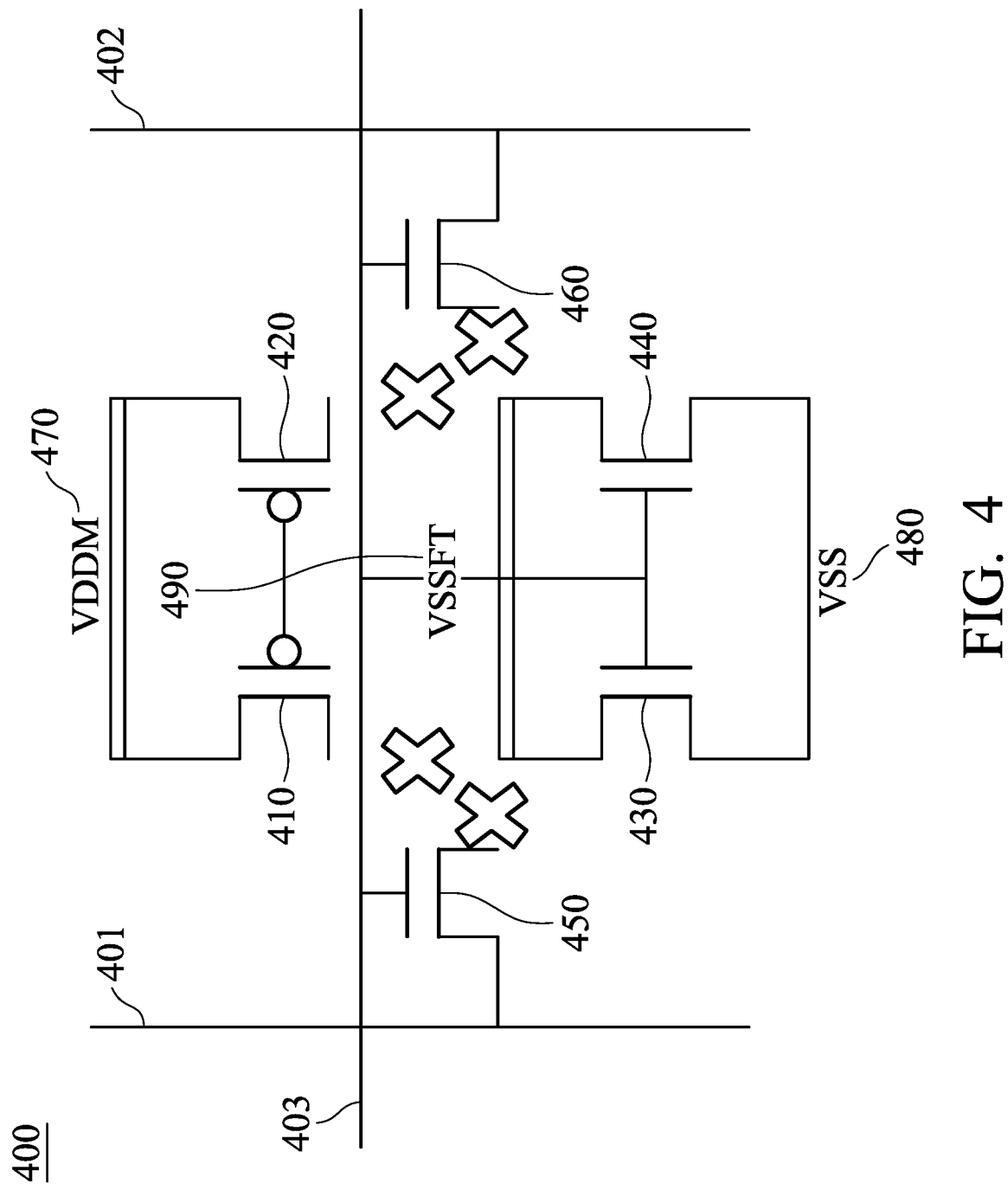
FIG. 4 illustrates another exemplary circuit in an edge cell of a memory device, in accordance with some embodiments of the present disclosure.

FIG. 4 illustrates another exemplary circuit 400 in an edge cell of a memory device, e.g. the memory device 100 in FIG. 1, in accordance with some embodiments of the present disclosure. As shown in FIG. 4, the circuit 400 includes a pair of PMOS transistors 410, 420 and a pair of NMOS transistors 430, 440. Gates of the PMOS transistors 410, 420 are coupled to each other. Sources of the PMOS transistors 410, 420 are coupled to a positive power supply voltage (VDDM) 470.

As shown in FIG. 4, gates of the NMOS transistors 430, 440 are coupled to each other and coupled to a word line 403 crossing the edge cell. Sources of the NMOS transistors 430, 440 are coupled to a power footer supply voltage (VSSFT) 490 for controlling the memory cells of the memory device to enter or exit the power down mode (or say power saving mode). Drains of the NMOS transistors 430, 440 are coupled to a negative power supply voltage (VSS) 480.

As shown in FIG. 4, the NMOS transistors 430, 440 can function as a power switch, called a power footer, for controlling the power footer supply voltage (VSSFT) 490. When the word line 403 of the edge cell switches from a logic high power level to a logic low power level, the power footer is disabled and the VSSFT 490 is floating. Because the VSSFT lines of the memory cells are electrically connected to the VSSFT 490, the array of memory cells enters the power down mode and no current flows into the memory cells. When the word line 403 of the edge cell switches from a logic low power level to a logic high power level, the power footer is enabled and the VSSFT 490 has the same voltage as the VSS 480. Because the VSSFT lines of the memory cells are electrically connected to the VSSFT 490, current flows into (or out of) the memory cells such that the memory cells exit the power down mode.

As shown in FIG. 4, the circuit 400 also includes a pair of NMOS transistors 450, 460 whose gates are coupled to the word line 403. Source of the NMOS transistor 450 is coupled to a bit line 401 crossing the edge cell; and source of the NMOS transistor 460 is coupled to a bit line bar 402 crossing the edge cell. The term "bar" as used in this context indicates a logically inverted signal. As shown in FIG. 4, drain of the PMOS transistor 410 is not electrically connected to the NMOS transistor 450; and drain of the PMOS transistor 420 is not electrically connected to the NMOS transistor 460.

Figure 5:
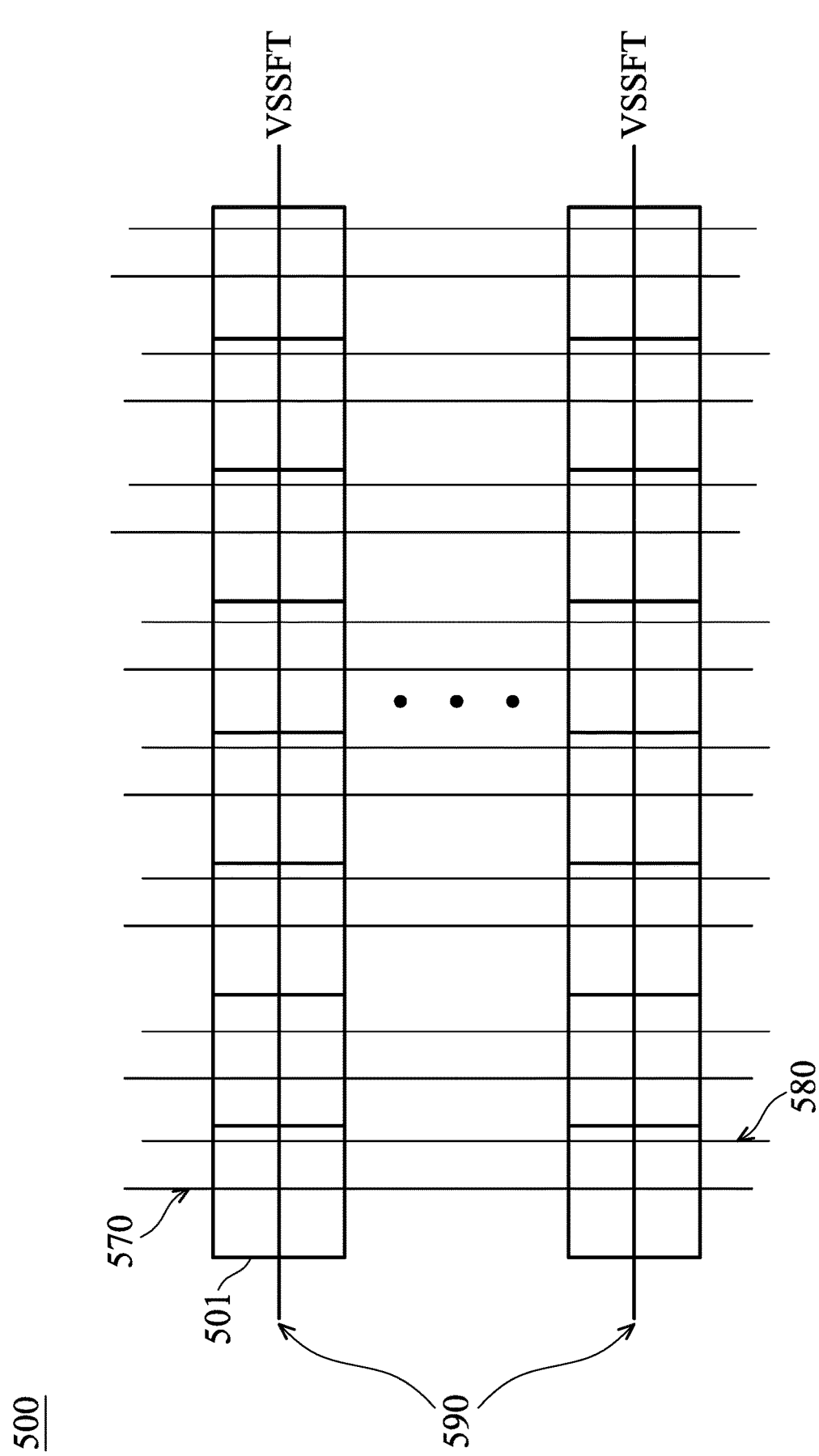
FIG. 5 illustrates another exemplary layout of edge cells in a memory device, in accordance with some embodiments of the present disclosure.

FIG. 5 illustrates an exemplary power mesh layout 500 of edge cells in a memory device, e.g. the first edge cell rows 122 and/or the second edge cell rows 132 of the memory device 100 in FIG. 1, in accordance with some embodiments of the present disclosure. As shown in FIG. 5, the edge cells 501 are arranged in multiple edge cell rows, each of which has a corresponding VSSFT line 590 that crosses all edge cells 501 of the edge cell row, like the VSSFT 490 in FIG. 4. Each edge cell 501 also has a VDDM line 570 crossing by and a VSS line 580 crossing by. The edge cells 501 arranged in a same column may share a same VDDM line 570 and a same VSS line 580. The directions of the VSSFT lines 590, the VDDM lines 570, and the VSS lines 580 are merely for illustration, and can be different in accordance with different embodiments. In some embodiments, the VDDM lines 570 and the VSS lines 580 are formed in a M0 metal layer of the memory device, while the VSSFT lines 590 are formed in a M1 metal layer above the M0 metal layer.

In some embodiments, referring back to FIG. 1, some edge cells of the memory device 100 include power headers, while other edge cells of the memory device 100 include power footers. For example, each first edge cell 122 comprises a pair of PMOS transistors whose gates are coupled to each other and coupled to a word line of the first edge cell 122; sources of the pair of PMOS transistors are coupled to a positive power supply voltage of the first edge cell 122; and drains of the pair of PMOS transistors are coupled to a power header supply voltage of the first edge cell 122 to control the array of memory cells to enter or exit a power down mode. At the same time, each second edge cell 132 comprises a pair of NMOS transistors whose gates are coupled to each other and coupled to a word line of the second edge cell 132. Sources of the pair of NMOS transistors are coupled to a power footer supply voltage of the second edge cell 132; and drains of the pair of NMOS transistors are coupled to a negative power supply voltage of the second edge cell 132 to control the array of memory cells to enter or exit the power down mode.

Figure 6:
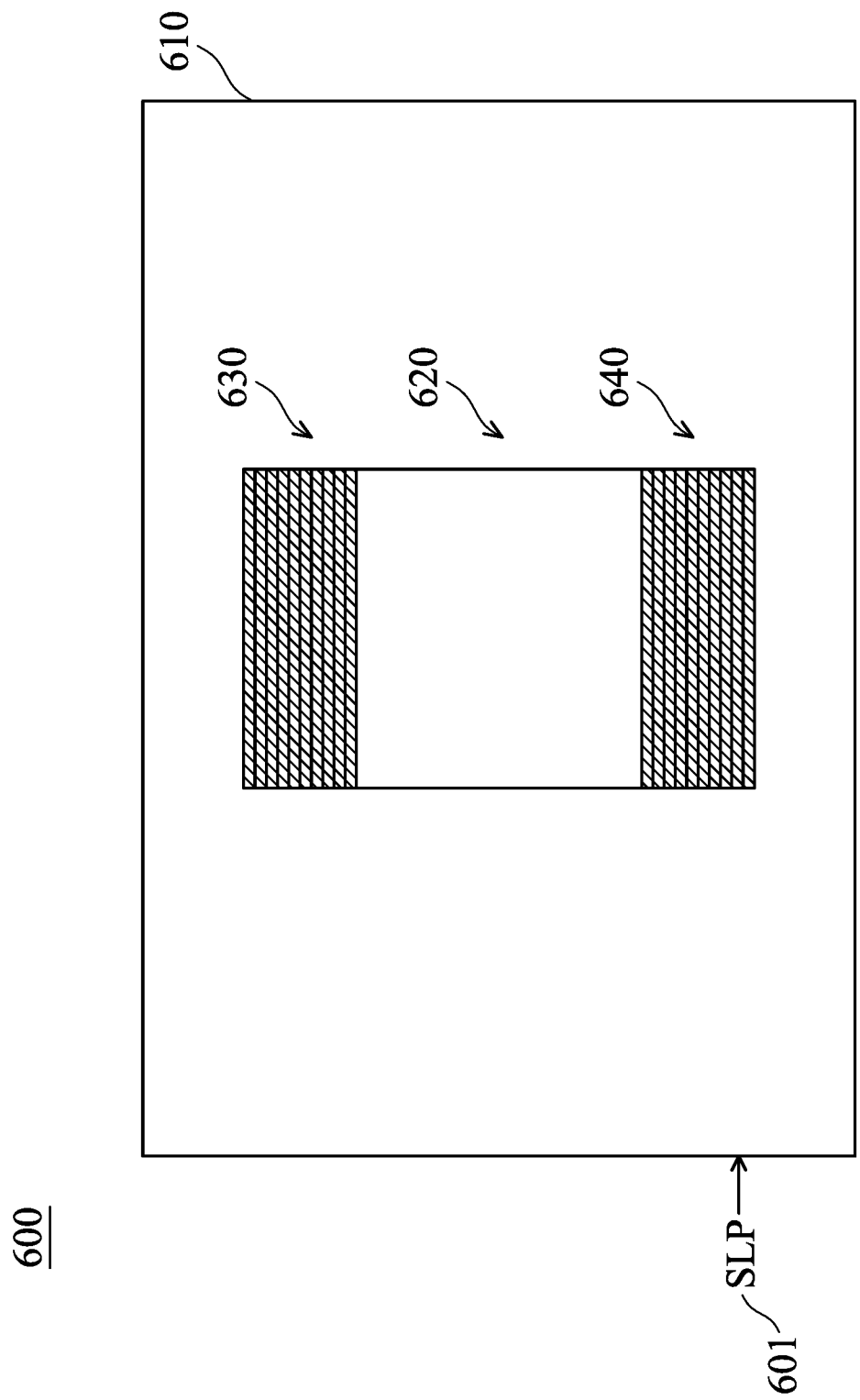
FIG. 6 illustrates an exemplary memory device controlled by a power management signal, in accordance with some embodiments of the present disclosure.

FIG. 6 illustrates an exemplary memory device 610 controlled by a power management signal 601, in accordance with some embodiments of the present disclosure. The memory device 610 in this example includes an array of memory cells 620, a plurality of first edge cells 630 on one side of the array of memory cells 620, a plurality of second edge cells 640 on the opposite side of the array of memory cells 620, and may include other related circuits for reading, writing and/or controlling the memory, e.g. sense amplifier, decoders, etc.

In some embodiments, while the edge cells 630, 640 function as power headers or power footers to control a power supply to the array of memory cells 620, voltages of the word lines of the plurality of first edge cells 630 and the plurality of second edge cells 640 may be controlled by a common power management signal 601 to enable or disable the power supply to the array of memory cells 620. The power management signal 601 may be called a sleep (SLP)

signal to control the array of memory cells 620 to enter a power down mode (or say go to sleep), or exit the power down mode (or say wake up). In some embodiments, the SLP signal 601 may be a programmed input from a power management control pin.

Figure 7A:
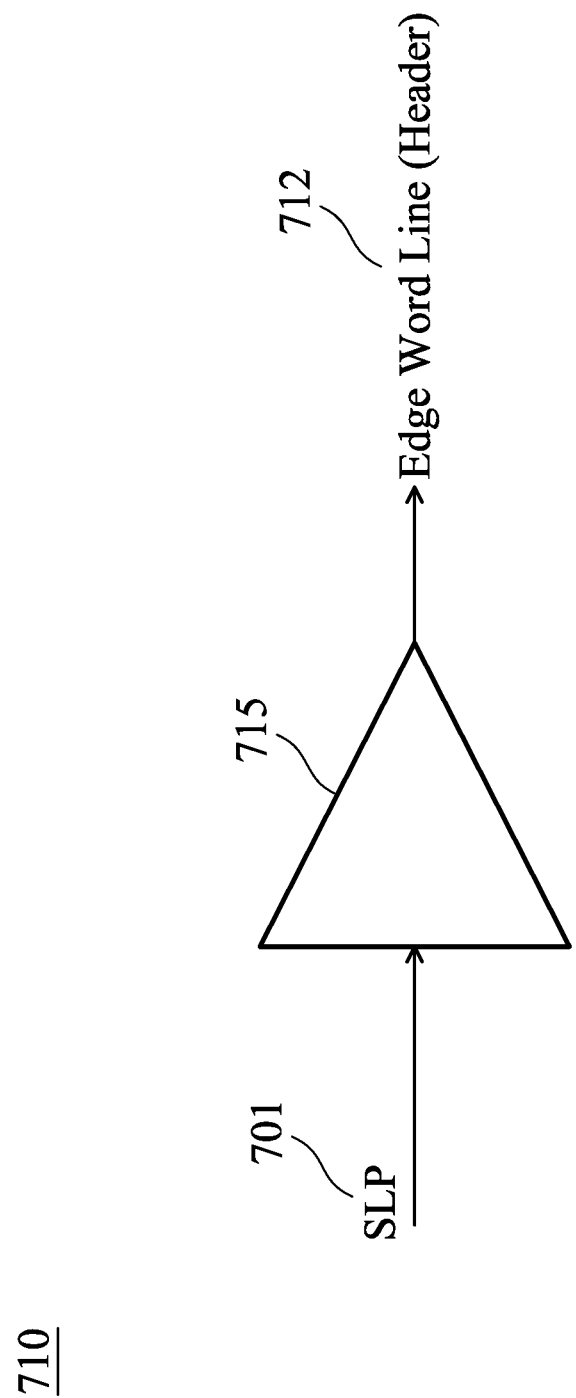
FIG. 7A illustrates an exemplary relationship between a power management signal and an edge word line signal coupled to a power header, in accordance with some embodiments of the present disclosure.

FIG. 7A illustrates an exemplary relationship 710 between a power management signal 701 and an edge word line signal 712 coupled to a power header, in accordance with some embodiments of the present disclosure. In some embodiments, the power management signal 701 corresponds to the SLP signal 601 in the memory device 610 of FIG. 6; and the edge word line signal 712 corresponds to a word line signal of an edge cell serving as a power header in the memory device 610 of FIG. 6. As shown in FIG. 7A, the voltage of the word line signal 712 coupled to a power header is logically controlled by the power management signal 701 with a delay circuit 715. That is, the word line signal 712 coupled to a power header may be a delayed version of the SLP signal 701.

Figure 7B:
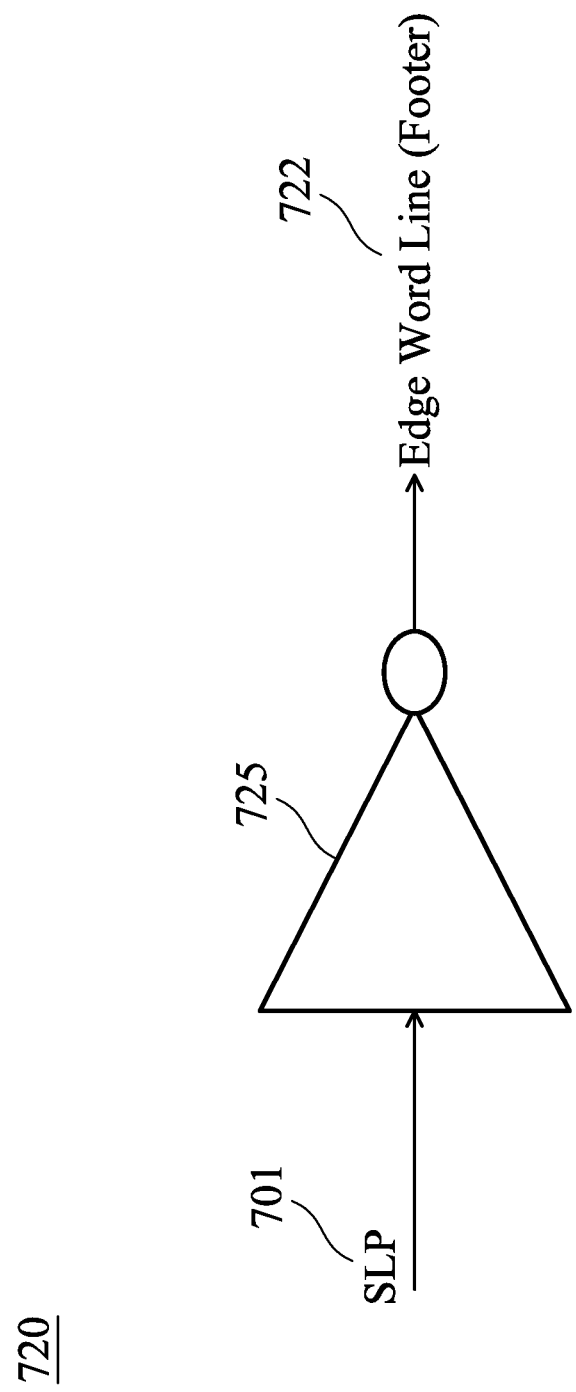
FIG. 7B illustrates an exemplary relationship between a power management signal and an edge word line signal coupled to a power footer, in accordance with some embodiments of the present disclosure.

FIG. 7B illustrates an exemplary relationship 720 between the power management signal 701 and an edge word line signal 722 coupled to a power footer, in accordance with some embodiments of the present disclosure. In some embodiments, the power management signal 701 corresponds to the SLP signal 601 in the memory device 610 of FIG. 6; and the edge word line signal 722 corresponds to a word line signal of an edge cell serving as a power footer in the memory device 610 of FIG. 6. As shown in FIG. 7B, the voltage of the word line signal 722 coupled to a power footer is logically controlled by the power management signal 701 with an invertor circuit 725. That is, the word line signal 722 coupled to a power footer may be a delayed and inverted version of the SLP signal 701. As such, the word line signal 722 is an inversion of the word line signal 712.

Figure 8:
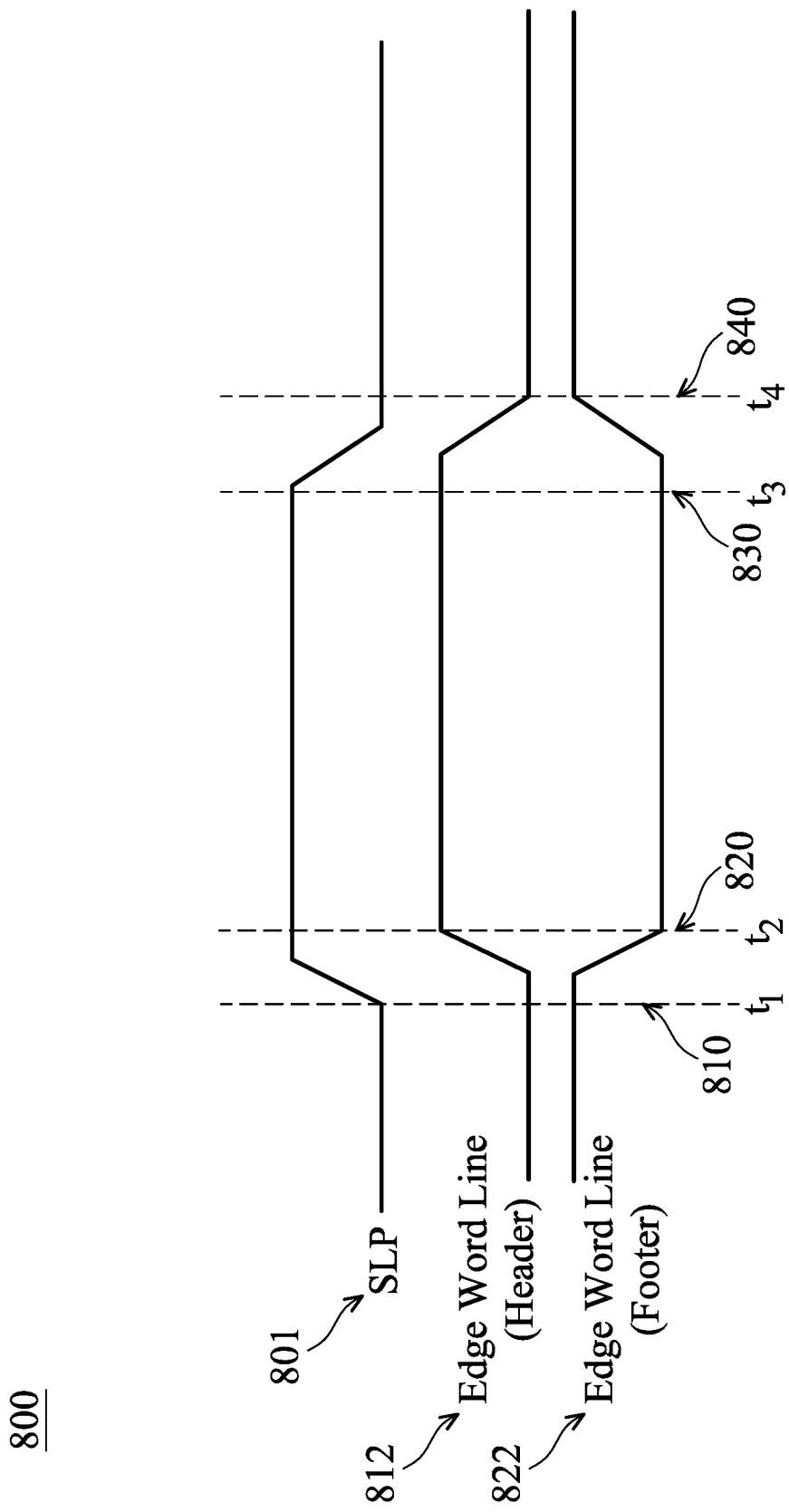
FIG. 8 illustrates timing waveforms of signals in an exemplary memory device at different power modes, in accordance with various embodiments of the present disclosure.

FIG. 8 illustrates timing waveforms 800 of signals in an exemplary memory device, e.g. the memory device as described in FIGS. 1-7, at different power modes, in accordance with various embodiments of the present disclosure. The exemplary signals in FIG. 8 represent a SLP signal 801, a word line signal 812 of a power header edge cell, and a word line signal 822 of a power footer edge cell, respectively. In accordance with various embodiments, the SLP signal 801 in FIG. 8 may represent any one of the SLP signals 601, 701 in FIG. 6, FIG. 7A and FIG. 7B respectively; the word line signal 812 in FIG. 8 may represent any one of the word line signals 203, 712 in FIG. 2 and FIG. 7A respectively; and the word line signal 822 in FIG. 8 may represent any one of the word line signals 403, 722 in FIG. 4 and FIG. 7B respectively.

Each of the signals can transition between a logic high power state (e.g., VDDM) and a logic low power state (e.g., VSS) over time. In some embodiments, before time "$t_1$" 810, the memory device operates normally where the sleep signal SLP 801 is not activated. As such, the sleep signal SLP 801 has a voltage at logic low. In some embodiments, the same sleep signal SLP 801 controls the word line signals of all edge cells in the memory device, e.g. according to the relationships shown in FIG. 7A and/or FIG. 7B. Accordingly, the word line signal 812 of a power header edge cell, being a delayed version of the sleep signal SLP 801, has a voltage at logic low; and the word line signal 822 of a power footer edge cell, being a delayed and inverted version of the sleep signal SLP 801, has a voltage at logic high. As discussed above, e.g. referring to FIG. 2, when a word line signal of a power header edge cell has a logic low power level, the PMOS transistors 210, 220 in the power header edge cell are in an ON state, such that the VDDHD line 290 has a same voltage as the VDDM 270. Referring to FIG. 4, when a word line signal of a power footer edge cell has a logic high power level, the NMOS transistors 430, 440 in the power footer edge cell are in an ON state, such that the VSSFT line 490 has a same voltage as the VSS 480. Accordingly, the memory cells of the memory device are in a normal power mode, before time "$t_1$" 810.

At time "$t_1$" 810, a first event is detected to activate the sleep signal SLP 801, by pulling up the sleep signal SLP 801 from logic low to logic high. According to various embodiments, the first event may be related to at least one of the following: a user turns off the memory device or an apparatus including the memory device; a threshold time is reached based on a predetermined program; or a battery level for the memory device is below a predetermined threshold. Accordingly, the word line signal 812 of a power header edge cell, being a delayed version of the sleep signal SLP 801, is pulled up from logic low to logic high after a time delay from the time "$t_1$" 810; and the word line signal 822 of a power footer edge cell, being a delayed and inverted version of the sleep signal SLP 801, is pulled down from logic high to logic low after the time delay from the time "$t_1$" 810.

As discussed above, e.g. referring to FIG. 2, when a word line signal of a power header edge cell switches to a logic high power level, the PMOS transistors 210, 220 in the power header edge cell are switched to an OFF state, such that the VDDHD line 290 is floating and there is no current flowing into the VDDHD line 290. Referring to FIG. 4, when a word line signal of a power footer edge cell switches to a logic low power level, the NMOS transistors 430, 440 in the power footer edge cell are switched to an OFF state, such that the VSSFT line 490 is floating and there is no current flowing into the VSSFT line 490. Accordingly, when the VDDHD lines and/or the VSSFT lines of all edge cells are settled at a floating state at time "$t_2$" 820, the memory device enters a power down mode or power saving mode.

Then at time "$t_3$" 830, a second event is detected to deactivate the sleep signal SLP 801, by pulling down the sleep signal SLP 801 from logic high to logic low. According to various embodiments, the second event may be related to at least one of the following: a user turns on the memory device or an apparatus including the memory device; a threshold time is reached based on a predetermined program; or a battery level for the memory device is above a predetermined threshold. Accordingly, the word line signal 812 of a power header edge cell, being a delayed version of the sleep signal SLP 801, is pulled down from logic high to logic low after a time delay from the time "$t_3$" 830; and the word line signal 822 of a power footer edge cell, being a delayed and inverted version of the sleep signal SLP 801, is pulled up from logic low to logic high after the time delay from the time "$t_3$" 830.

As discussed above, e.g. referring to FIG. 2, when a word line signal of a power header edge cell switches to a logic low power level, the PMOS transistors 210, 220 in the power header edge cell are switched to an ON state, such that the VDDHD line 290 has a same voltage as the VDDM 270. Referring to FIG. 4, when a word line signal of a power footer edge cell switches to a logic high power level, the NMOS transistors 430, 440 in the power footer edge cell are switched to an ON state, such that the VSSFT line 490 has a same voltage as the VSS 480. Accordingly, when the VDDHD lines and/or the VSSFT lines of all edge cells are settled to VDD or VSS power state at time "$t_4$" 840, the memory device exits the power down mode or power saving mode, and returns back to the normal power mode, to read or write the memory.

Figure 9:
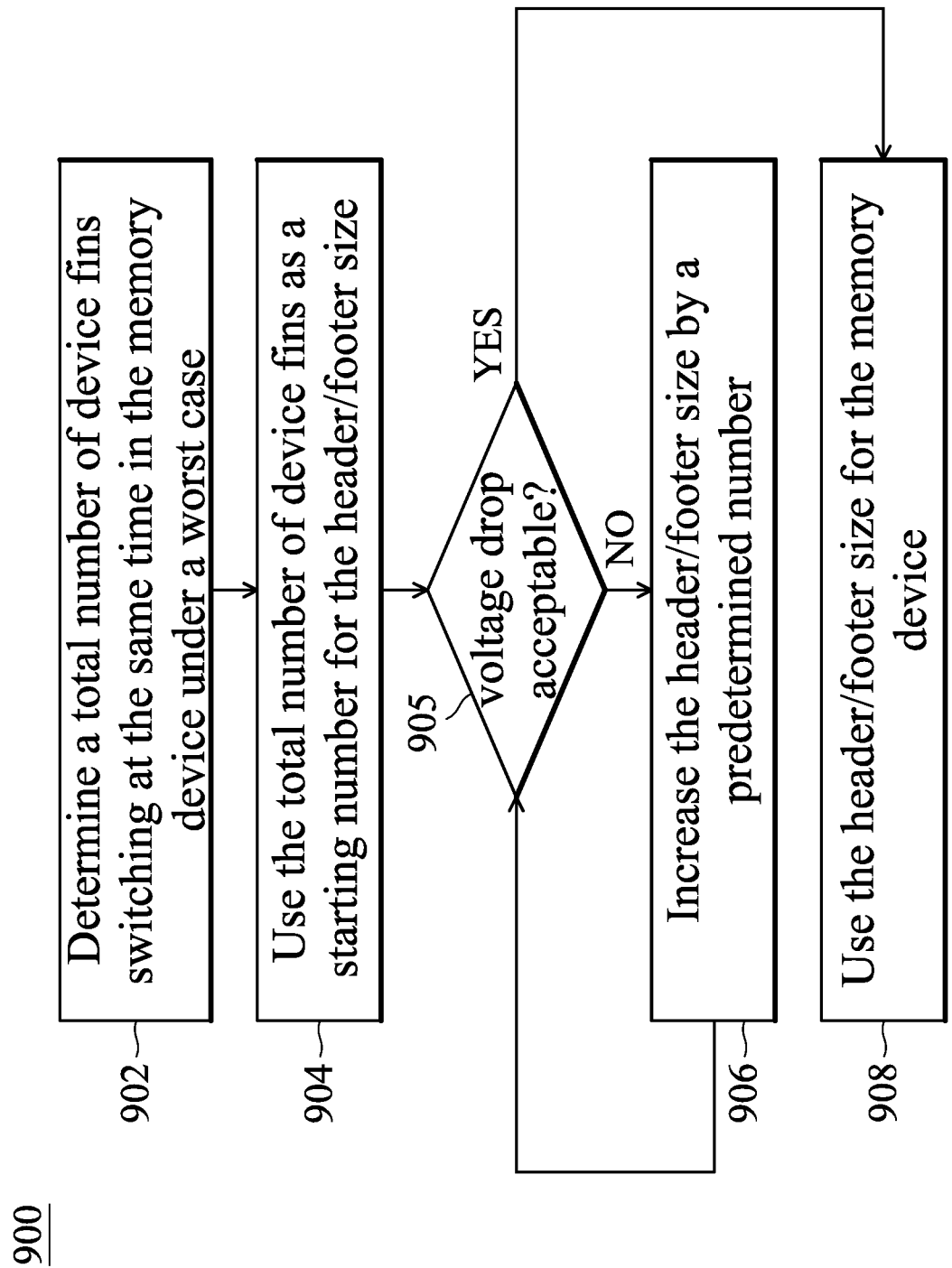
FIG. 9 shows a flow chart illustrating an exemplary method for determining a number of headers and/or footers in an exemplary memory device, in accordance with some embodiments of the present disclosure.

FIG. 9 shows a flow chart illustrating an exemplary method 900 for determining a number of headers and/or footers (or say header and/or footer size) in an exemplary memory device, e.g. the memory device as described in FIGS. 1-8, in accordance with some embodiments of the present disclosure. At operation 902, a total number of device fins switching at the same time in the memory device is determined under a worst case. At operation 904, the total number of device fins is used as a starting number for the header/footer size. At operation 905, it is determined whether a voltage drop is acceptable for this header/footer size. If so, the process goes directly to operation 908, where the header/footer size is used for the memory device. In one embodiment, the voltage drop is acceptable at operation 905 when the voltage drop is less than 7%. In another embodiment, the voltage drop is acceptable at operation 905 when the timing degradation is less than 3%.

If it is determined that the voltage drop is not acceptable for the header/footer size at operation 905, the process goes to operation 906, where the header/footer size is increased by a predetermined number. Then, the process goes back to operation 905 to check again whether the voltage drop is acceptable for increased header/footer size. The header/footer size increasing will stop when the voltage drop is acceptable at operation 905. The order of the operations shown in FIG. 9 may be changed according to different embodiments of the present disclosure.

Figure 10:
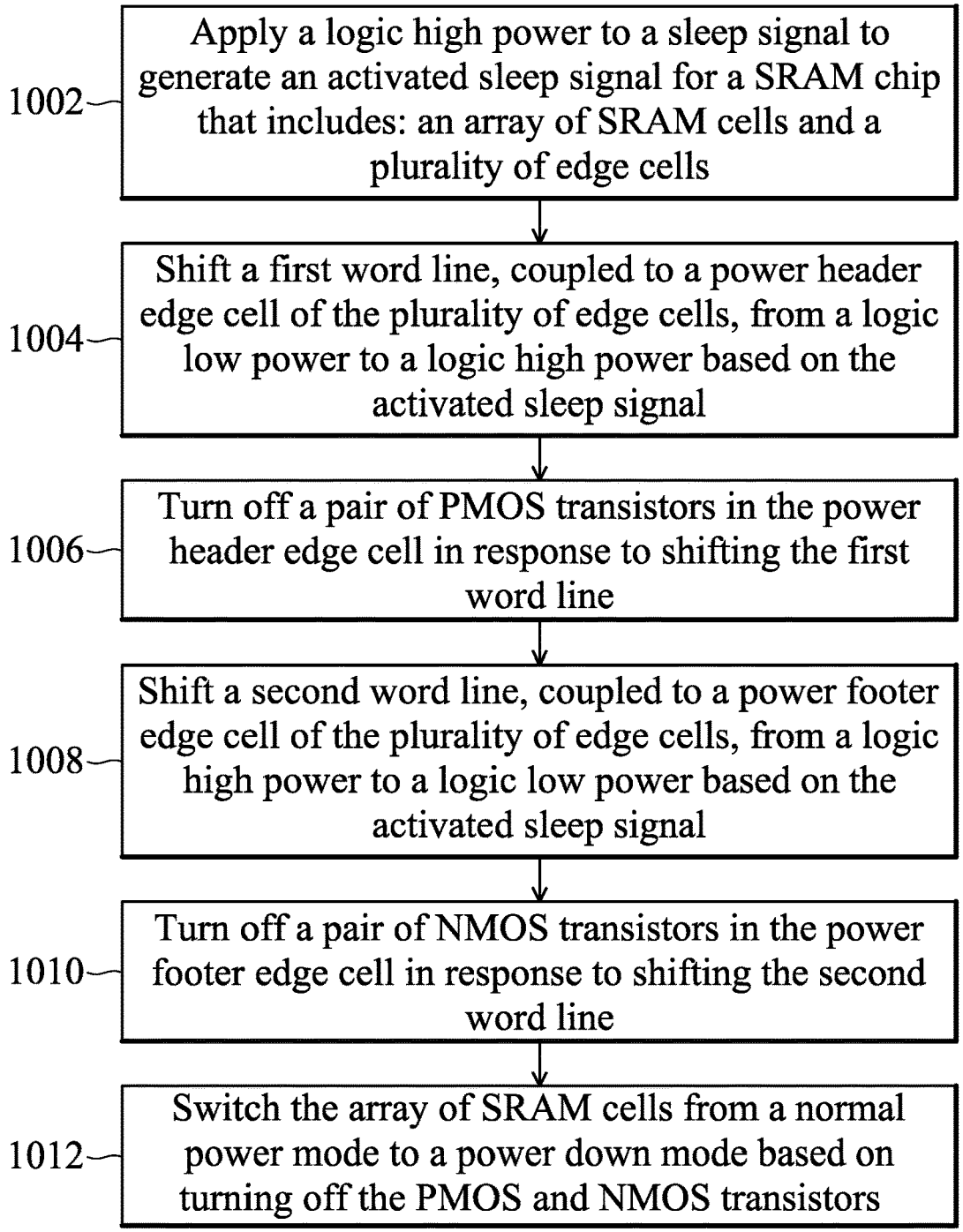
FIG. 10 shows a flow chart illustrating an exemplary method for operating a static random access memory (SRAM) chip that includes an array of SRAM cells and a plurality of edge cells, in accordance with some embodiments of the present disclosure.

FIG. 10 shows a flow chart illustrating an exemplary method for operating a static random access memory (SRAM) chip that includes an array of SRAM cells and a plurality of edge cells, in accordance with some embodiments of the present disclosure. In some embodiments, the SRAM chip is a memory device as described in FIGS. 1-9. At operation 1002, a logic high power is applied to a sleep signal to generate an activated sleep signal for the SRAM chip. At operation 1004, a first word line, coupled to a power header edge cell of the plurality of edge cells, is shifted from a logic low power to a logic high power based on the activated sleep signal. At operation 1006, a pair of PMOS transistors in the power header edge cell is turned off in response to shifting the first word line. At operation 1008, a second word line, coupled to a power footer edge cell of the plurality of edge cells, is shifted from a logic high power to a logic low power based on the activated sleep signal. At operation 1010, a pair of NMOS transistors in the power footer edge cell is turned off in response to shifting the second word line. At operation 1012, the array of SRAM cells is switched from a normal power mode to a power down mode based on turning off the PMOS and NMOS transistors. The order of the operations shown in FIG. 10 may be changed according to different embodiments of the present disclosure.

In an embodiment, a memory device is disclosed. The memory device includes: an array of memory cells used for data storage; a plurality of first edge cells not used for data storage; and a plurality of second edge cells not used for data storage. The plurality of first edge cells and the plurality of second edge cells are arranged respectively at two opposite sides of the array of memory cells. At least one edge cell, among the plurality of first edge cells and the plurality of second edge cells, comprises a circuit configured for controlling the array of memory cells to enter or exit a power down mode.

In another embodiment, a static random access memory (SRAM) chip is disclosed. The SRAM chip includes: an array of SRAM cells used for data storage; a plurality of first edge cells not used for data storage; and a plurality of second edge cells not used for data storage. The plurality of first edge cells and the plurality of second edge cells are arranged respectively at two opposite sides of the array of SRAM cells. At least one edge cell, among the plurality of first edge cells and the plurality of second edge cells, comprises a power switch configured for controlling a power supply to the array of SRAM cells.

In yet another embodiment, an edge cell of a static random access memory (SRAM) chip is disclosed. The edge cell includes: a pair of PMOS transistors whose gates are coupled to each other, wherein sources of the pair of PMOS transistors are coupled to a positive power supply voltage; a pair of NMOS transistors whose gates are coupled to each other, wherein drains of the pair of NMOS transistors are coupled to a negative power supply voltage; and a word line configured to control an array of SRAM cells of the SRAM chip to enter or exit a power down mode.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
an array of memory cells;
at least one first edge cell; and
at least one second edge cell, wherein
the at least one first edge cell and the at least one second edge cell are arranged respectively at two opposite sides of the array of memory cells, and
at least one edge cell, among the at least one first edge cell and the at least one second edge cell, comprises a circuit configured for controlling the array of memory cells to enter or exit a power down mode.

2. The memory device of claim 1, wherein each edge cell of the at least one first edge cell and the at least one second edge cell comprises:
a pair of transistors whose gates are coupled to each other and coupled to a word line of each edge cell.

3. The memory device of claim 2, wherein:
the pair of transistors are p-type metal-oxide-semiconductor (PMOS) transistors;
sources of the pair of transistors are coupled to a positive power supply voltage; and
drains of the pair of transistors are coupled to a power header supply voltage for controlling the array of memory cells to enter or exit the power down mode.

4. The memory device of claim 3, wherein:
when the word line of the edge cell switches to a logic high power level, the array of memory cells enters the power down mode; and
when the word line of the edge cell switches to a logic low power level, the array of memory cells exits the power down mode.

5. The memory device of claim 2, wherein:
the pair of transistors are n-type metal-oxide-semiconductor (NMOS) transistors;
sources of the pair of transistors are coupled to a power footer supply voltage for controlling the array of memory cells to enter or exit the power down mode; and
drains of the pair of transistors are coupled to a negative power supply voltage.

6. The memory device of claim 5, wherein:
when the word line of the edge cell switches to a logic low power level, the array of memory cells enters the power down mode; and
when the word line of the edge cell switches to a logic high power level, the array of memory cells exits the power down mode.

7. The memory device of claim 2, wherein voltages of the word lines of the at least one first edge cells and the at least one second edge cell are controlled by a common power management signal.

8. The memory device of claim 1, wherein:
each first edge cell of the at least one first edge cell comprises a pair of PMOS transistors whose gates are coupled to each other and coupled to a word line of the at least one first edge cell; and
each second edge cell of the at least one second edge cell comprises a pair of NMOS transistors whose gates are coupled to each other and coupled to a word line of the at least one second edge cell.

9. The memory device of claim 7, wherein:
sources of the pair of PMOS transistors are coupled to a positive power supply voltage of the at least one first edge cell;
drains of the pair of PMOS transistors are coupled to a power header supply voltage of the at least one first edge cell;
sources of the pair of NMOS transistors are coupled to a power footer supply voltage of the at least one second edge cell; and
drains of the pair of NMOS transistors are coupled to a negative power supply voltage of the at least one second edge cell.

10. The memory device of claim 7, wherein:
a voltage of the word line of each first edge cell is controlled by a power management signal and a delay circuit; and
a voltage of the word line of each second edge cell is controlled by the power management signal and an invertor circuit.

11. A static random access memory (SRAM) chip, comprising:
an array of SRAM cells;
at least one first edge cell; and
at least one second edge cell, wherein
the at least one first edge cell and the at least one second edge cell are arranged respectively at two opposite sides of the array of SRAM cells, and
at least one edge cell, among the at least one first edge cell and the at least one second edge cell, comprises a power switch configured for controlling a power supply to the array of SRAM cells.

12. The SRAM chip of claim 11, wherein each edge cell of the at least one first edge cell and the at least one second edge cell comprises:
a pair of transistors whose gates are coupled to each other and coupled to a word line of each edge cell.

13. The SRAM chip of claim 12, wherein:
the pair of transistors are p-type metal-oxide-semiconductor (PMOS) transistors;
sources of the pair of transistors are coupled to a positive power supply voltage;
drains of the pair of transistors are coupled to a power header supply voltage;
when the word line of the edge cell switches to a logic high power level, the array of SRAM cells enters a power down mode; and
when the word line of the edge cell switches to a logic low power level, the array of SRAM cells exits the power down mode.

14. The SRAM chip of claim 12, wherein:
the pair of transistors are n-type metal-oxide-semiconductor (NMOS) transistors;
sources of the pair of transistors are coupled to a power footer supply voltage;
drains of the pair of transistors are coupled to a negative power supply voltage;
when the word line of the edge cell switches to a logic low power level, the array of SRAM cells enters a power down mode; and
when the word line of the edge cell switches to a logic high power level, the array of SRAM cells exits the power down mode.

15. The SRAM chip of claim 12, wherein voltages of the word lines of the at least one first edge cell and the at least one second edge cell are controlled by a common power management signal.

16. The SRAM chip of claim 11, wherein:
each first edge cell of the at least one first edge cell comprises a pair of PMOS transistors whose gates are coupled to each other and coupled to a word line of each first edge cell;
sources of the pair of PMOS transistors are coupled to a positive power supply voltage of each first edge cell;
drains of the pair of PMOS transistors are coupled to a power header supply voltage of the first edge cell;
each second edge cell of the at least one second edge cell comprises a pair of NMOS transistors whose gates are coupled to each other and coupled to a word line of each second edge cell;
sources of the pair of NMOS transistors are coupled to a power footer supply voltage of each second edge cell; and
drains of the pair of NMOS transistors are coupled to a negative power supply voltage of each second edge cell.

17. The SRAM chip of claim 16, wherein:
a voltage of the word line of each first edge cell is controlled by a power management signal and a delay circuit; and
a voltage of the word line of each second edge cell is controlled by the power management signal and an invertor circuit.

18. A method for operating a device that includes: an array of memory cells and a plurality of edge cells, comprising:
generating an activated sleep signal;
shifting a first word line, coupled to a power header edge cell of the plurality of edge cells, from a logic low power to a logic high power based on the activated sleep signal;
turning off at least one first transistor in the power header edge cell in response to shifting the first word line;

shifting a second word line, coupled to a power footer edge cell of the plurality of edge cells, from a logic high power to a logic low power based on the activated sleep signal;

turning off at least one second transistor in the power footer edge cell in response to shifting the second word line; and switching the array of memory cells from a normal power mode to a power down mode based on turning off the at least one first transistor and the at least one second transistor.

19. The method of claim 18, wherein:

the power header edge cell and the power footer edge cell are arranged respectively at two opposite sides of the array of memory cells;

a gate of the at least one first transistor is coupled to the word line;

a source of the at least one first transistors is coupled to a positive power supply voltage;

a drain of the at least one first transistor is coupled to a power supply to the array of memory cells;

a gate of the at least one second transistor is coupled to to the word line;

a source of the at least one second transistor is coupled to a power supply to the array of memory cells; and a drain of the at least one second transistor is coupled to a negative power supply voltage.

20. The method of claim 18, further comprising:

generating a deactivated sleep signal;

shifting the first word line, coupled to the power header edge cell of the plurality of edge cells, from a logic high power to a logic low power based on the deactivated sleep signal;

turning on the at least one first transistor in the power header edge cell;

shifting the second word line, coupled to the power footer edge cell of the plurality of edge cells, from a logic low power to a logic high power based on the deactivated sleep signal;

turning on the at least one second transistor in the power footer edge cell; and switching the array of memory cells from the power down mode to the normal power mode based on turning on the at least one first transistor and the at least one second transistor.

* * * * *